United States Patent
Yoshioka et al.

(10) Patent No.: US 10,060,989 B2
(45) Date of Patent: Aug. 28, 2018

(54) BATTERY STATE DETECTION APPARATUS

(71) Applicants: FURUKAWA ELECTRIC CO., LTD., Tokyo (JP); FURUKAWA AUTOMOTIVE SYSTEMS INC., Shiga (JP)

(72) Inventors: Kenichi Yoshioka, Shiga (JP); Shinya Saito, Shiga (JP); Yuuichi Watanabe, Shiga (JP); Yuji Matsui, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 282 days.

(21) Appl. No.: 14/900,131

(22) PCT Filed: Jun. 10, 2014

(86) PCT No.: PCT/JP2014/003073
§ 371 (c)(1),
(2) Date: Dec. 18, 2015

(87) PCT Pub. No.: WO2014/203492
PCT Pub. Date: Dec. 24, 2014

(65) Prior Publication Data
US 2016/0139211 A1    May 19, 2016

(30) Foreign Application Priority Data
Jun. 20, 2013  (JP) .................................. 2013-129737

(51) Int. Cl.
*G01N 27/416*  (2006.01)
*G01R 31/36*  (2006.01)
(Continued)

(52) U.S. Cl.
CPC ......... *G01R 31/3696* (2013.01); *G01R 1/203* (2013.01); *H01M 10/4285* (2013.01);
(Continued)

(58) Field of Classification Search
CPC ............................ G01R 31/3696; G01R 1/203
(Continued)

(56) References Cited

U.S. PATENT DOCUMENTS

2008/0030208 A1\*  2/2008  Aratani .................. G01R 1/203
                                                                324/713
2010/0201369 A1    8/2010  Gronwald et al.
(Continued)

FOREIGN PATENT DOCUMENTS

DE   102007033182 A1   1/2009
JP      2009063527 A   3/2009
(Continued)

OTHER PUBLICATIONS

International Search Report dated Sep. 16, 2014 for PCT Application No. PCT/JP2014/003073, 4 pages.

*Primary Examiner* — Farhana Hoque
(74) *Attorney, Agent, or Firm* — Amin, Turocy & Watson, LLP

(57) ABSTRACT

A board connection terminal (15) is connected to a circuit board that detects a current having flowed through a resistor element (10). The board connection terminal (15) includes an intermediate part (31) and two connecting parts (30) integrated with one another. The intermediate part (31) has a substantially linear shape, and is connected to a shunt resistor (7). The two connecting parts (30) have proximal ends thereof located at opposite ends of the intermediate part (31), and protrude in a direction substantially perpendicular to the intermediate part (31), to be connected to the circuit board. The two connecting parts (30) are arranged substan-
(Continued)

tially in parallel to each other. The board connection terminal (15) comprises two board connection terminals (15) that are arranged with the resistor element (10) sandwiched therebetween. Contact resistance between the intermediate part (31) and the shunt resistor (7) is lower than conductor resistance of the intermediate part (31).

5 Claims, 9 Drawing Sheets

(51) Int. Cl.
*H01M 10/48* (2006.01)
*H01M 10/42* (2006.01)
*G01R 1/20* (2006.01)
*H01R 11/28* (2006.01)
*H01R 12/55* (2011.01)

(52) U.S. Cl.
CPC ............ *H01M 10/48* (2013.01); *H01R 11/287* (2013.01); *H01R 12/55* (2013.01)

(58) Field of Classification Search
USPC .......................................... 324/426, 430, 437
See application file for complete search history.

(56) References Cited

U.S. PATENT DOCUMENTS

2012/0126818 A1* 5/2012 Ishihara ............. G01R 31/3696
324/426
2014/0015636 A1 1/2014 Tanaka et al.

FOREIGN PATENT DOCUMENTS

| JP | 2009244065 A | 10/2009 |
| JP | 2011210610 A | 10/2011 |
| JP | 2012215452 A | 11/2012 |
| WO | 2009010313 A1 | 1/2009 |

* cited by examiner (a)

(b) ELECTRICAL EQUIVALENT CIRCUIT

Fig.8

| PULSE ON | THE NUMBER OF DISCHARGES | 1ST | 2ND | 3RD | 4TH | 5TH |
|---|---|---|---|---|---|---|
| | SENSOR[A] | -4.284 | -4.278 | -4.282 | -4.273 | -4.273 |
| | LOGGER[A] | -4.288 | -4.286 | -4.278 | -4.287 | -4.278 |
| | DIFFERENCE[A] | 0.005 | 0.008 | -0.004 | 0.014 | 0.006 |

| DIFFERENCE BETWEEN ON AND OFF ΔI | THE NUMBER OF DISCHARGES | 1ST | 2ND | 3RD | 4TH | 5TH |
|---|---|---|---|---|---|---|
| | SENSOR[A] | 4.312 | 4.315 | 4.313 | 4.301 | 4.301 |
| | LOGGER[A] | 4.300 | 4.301 | 4.299 | 4.299 | 4.293 |
| | DIFFERENCE[A] | 0.012 | 0.014 | 0.015 | 0.002 | 0.008 |

PRIOR ART (a) CONVENTIONAL CONFIGURATION (b) ELECTRICAL EQUIVALENT CIRCUIT (CONVENTIONAL)

BATTERY STATE DETECTION APPARATUS

CROSS-REFERENCE TO RELATED APPLICATION

The subject application is a U.S. National Stage Application under 35 U.S.C. § 371 of patent cooperation treaty (PCT) Patent Application No. PCT/JP2014/003073, filed Jun. 10, 2014, and entitled "BATTERY STATE DETECTION APPARATUS", which claims priority to Japanese Patent Application Serial No. 2013-129737, filed Jun. 20, 2013, the disclosures of each of which applications are incorporated herein by reference in their entireties.

TECHNICAL FIELD

The present invention relates to a battery state detection apparatus, and particularly to a configuration of a board connection terminal that connects a shunt resistor to a circuit board.

BACKGROUND ART

A battery state detection apparatus (battery sensor) that detects the state of a battery has been conventionally known. Such a battery state detection apparatus is disclosed in, for example, Patent Documents 1 and 2.

This type of battery state detection apparatus includes a circuit board and a shunt resistor for detecting a current. Referring to FIG. 9, a shunt resistor 7 is configured such that a resistor element 10 (made of Manganin, for example) whose resistance value is known is arranged between a first conductor part 11 and a second conductor part 12.

Each of the first conductor part 11 and the second conductor part 12 is provided with a board connection terminal 15. The board connection terminal 15 includes a connecting part 30 to be connected to a circuit board (not shown).

In the conventional battery state detection apparatus, as shown in FIG. 9, the board connection terminal 15 is mounted to the shunt resistor 7 with a mounting screw. This structure, which enables the board connection terminal 15 to be electrically and mechanically connected to the shunt resistor 7 with reliability, can ensure a high degree of accuracy of sensing.

The circuit board is configured to apply pulse discharge so that a pulse current flows through the shunt resistor 7, and also to detect, for example, the intensity of a current having flowed through the resistor element 10 at a time of the pulse discharge. The state of a battery can be determined based on, for example, a current value detected at this time. Since a method for determining the battery state through pulse discharge is known, a detailed description thereof is omitted.

Conventionally, the battery state detection apparatus has adopted the known four-terminal method for the detection of a current. As well known, adoption of the four-terminal method enables accurate measurement of a current. FIG. 10(b) shows an equivalent circuit that detects a current having flowed through the resistor element 10 by means of the four-terminal method.

As shown in FIG. 9, the conventional board connection terminal 15 is configured to have a slit formed therein so that two connecting parts 30 are provided. More specifically, the board connection terminal 15 arranged at the first conductor part 11 side is provided with two connecting parts 30c and 30d. On the other hand, the board connection terminal 15 arranged at the second conductor part 12 side is provided with two connecting parts 30a and 30b. Thus, four connecting parts 30 in total are arranged on the shunt resistor 7, which enables a current having flowed through the resistor element 10 to be measured by using the four-terminal method.

In the conventional battery state detection apparatus, to achieve the equivalent circuit shown in FIG. 10(b), the four connecting parts 30 (30a, 30b, 30c, 30d) are arranged in a straight line (FIG. 10(a)).

PRIOR-ART DOCUMENTS

Patent Documents

Patent Document 1: Japanese Patent Application Laid-Open No. 2011-210610
Patent Document 2: Japanese Patent Application Laid-Open No. 2012-215452

SUMMARY OF THE INVENTION

Problems to be Solved by the Invention

The configuration shown in FIG. 10(a), in which the four connecting parts 30 are arranged in a straight line, makes it necessary to ensure a space with respect to the direction of arrangement of the connecting parts 30. This largely constrains arrangement of the board connection terminal 15. Additionally, the conventional configuration requires that the board connection terminal 15 have a reception hole for receiving a mounting screw 28, as shown in FIG. 9. This makes the shape of the board connection terminal 15 complicated, and therefore downsizing of the board connection terminal 15 is not easy.

Meanwhile, the connecting parts 30 of the board connection terminal 15, which are soldered to a circuit board (not shown), are mechanically coupled to the circuit board. Thus, the connecting parts 30 are affected by vibrations and shocks of the circuit board. In this respect, the conventional configuration shown in FIGS. 9 and 10, in which the four connecting parts 30 are arranged in a straight line, has an unbalanced structure that cannot easily relieve the vibrations and shocks of the circuit board. This is why there is still room for improvement in terms of reliability and durability.

The present invention has been made in view of the circumstances described above, and a primary object of the present invention is to provide a battery state detection apparatus with enhanced reliability and durability, whose board connection terminal has improved configuration and layout.

Means for Solving the Problems and Effects Thereof

Problems to be solved by the present invention are as described above, and next, means for solving the problems and effects thereof will be described.

In an aspect of the invention of the present application, a battery state detection apparatus having the following configuration is provided. The battery state detection apparatus includes a shunt resistor and a board connection terminal. The shunt resistor includes a resistor element. The board connection terminal is connected to a circuit board that detects a current having flowed through the resistor element. The board connection terminal includes an intermediate part and two connecting parts integrated with one another. The intermediate part has a substantially linear shape, and is connected to the shunt resistor. The two connecting parts have proximal ends thereof located at opposite ends of the intermediate part, and protrude in a direction substantially perpendicular to the intermediate part, to be connected to the circuit board. The two connecting parts are arranged substantially in parallel to each other. The board connection terminal comprises two board connection terminals that are arranged with the resistor element sandwiched therebetween. Contact resistance between the intermediate part and the shunt resistor is lower than conductor resistance of the intermediate part.

Since the board connection terminal has a substantially C-like shape (or substantially U-like shape), the configuration of the board connection terminal is simplified as compared with conventional. Thus, downsizing can be achieved. The configuration in which the contact resistance between the intermediate part and the shunt resistor is set sufficiently lower than the conductor resistance of the intermediate part enables a current to be measured based on the four-terminal method, thus achieving measurement with a high accuracy.

In the battery state detection apparatus, it is preferable that the number of the connecting parts provided is four, and the four connecting parts are arranged so as to define the corner points of a rectangle when seen in a longitudinal direction of the connecting parts.

Such an arrangement of the four connecting parts achieves an improved balanced arrangement of the connecting parts as compared with the conventional configuration. Accordingly, distribution of vibrations or shocks of the circuit board is facilitated. Thus, durability and reliability can be enhanced. Here, it is to be noted that the term "rectangle" includes squares.

In the battery state detection apparatus, it is preferable that the intermediate part of the board connection terminal is connected to the shunt resistor by welding.

Since the intermediate part is connected to the shunt resistor by welding, the contact resistance between the board connection terminal and the shunt resistor is sufficiently lower than the conductor resistance of the intermediate part. As a result, precise current measurement is enabled by means of the four-terminal method.

In the battery state detection apparatus, it is preferable that a proximal end portion of the connecting part has a larger width than the width of a distal end portion of the connecting part that is connected to the circuit board.

Providing the connecting part with the proximal end portion having a larger width can ensure a strength of the board connection terminal. Since the distal end portion is thin, heat is not likely to diffuse when the distal end portion is soldered to the circuit board. This leads to enhancement of solderability.

The battery state detection apparatus includes a circuit board that is electrically connected to the connecting part of the board connection terminal.

Since the four connecting parts are connected to the circuit board, precise current measurement based on the four-terminal method can be made on the circuit board.

BRIEF DESCRIPTION OF THE DRAWINGS

FIG. 8 Tables showing measurement errors for the shunt resistor of the embodiment.

EMBODIMENT FOR CARRYING OUT THE INVENTION

An embodiment of the present invention will be described with reference to the drawings. Here, to facilitate comparison with the conventional configuration which has been described with reference to FIGS. 9 and 10, component parts of this embodiment similar to component parts of the conventional configuration are denoted by the same reference signs as those of the conventional ones, and the same reference sings are given on the diagrams (FIGS. 1 to 7) showing this embodiment, too. Differences of this embodiment from the conventional configuration will be clarified later.

Figure 1:
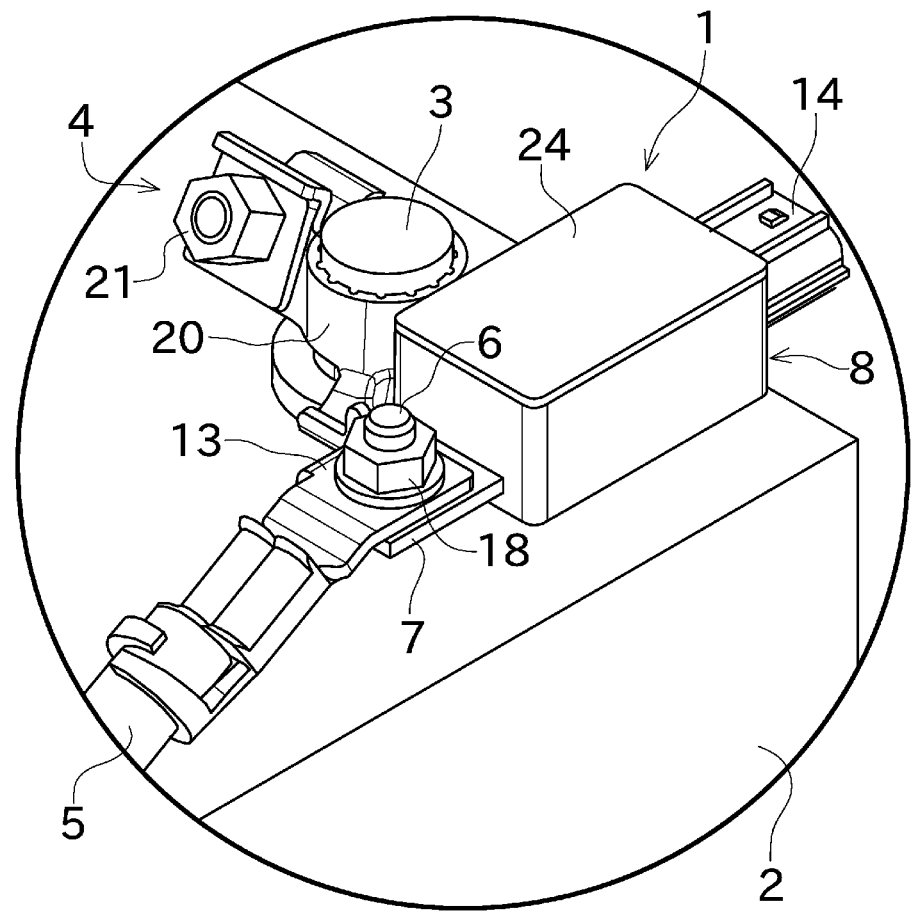
FIG. 1 A perspective view showing a battery state detection apparatus in use according to an embodiment of the present invention.

As shown in FIG. 1, a battery state detection apparatus 1 of this embodiment includes a battery post terminal 4 for connection to a battery post 3 included in a battery 2, a harness connecting part 6 for connection to a harness 5 that is connected to a load (not shown), and a casing 8.

Figure 2:
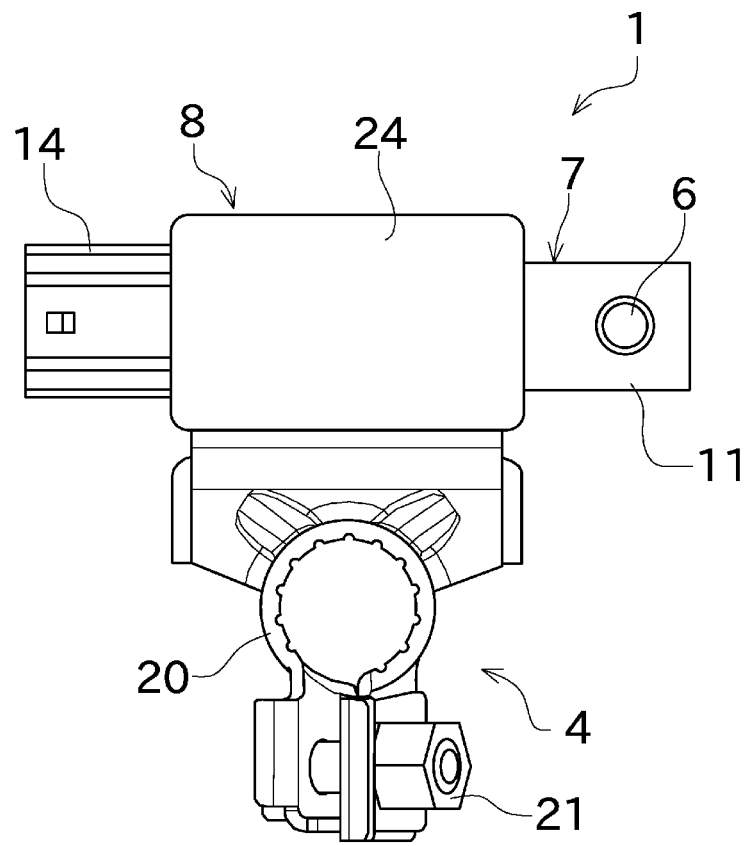
FIG. 2 A plan view of the battery state detection apparatus.

The battery post terminal 4 is formed of a metal plate through a stamping or bending process. Referring to FIGS. 1 and 2, the battery post terminal 4 includes a battery post connecting part 20 for connection to the battery post 3 of the battery 2. The battery post connecting part 20 has a substantially tube-like shape. Under a state where this tube-like portion receives the battery post 3 therein, a tightening bolt 21 is tightened, so that the tube-like portion bites into a peripheral surface of the battery post 3, thereby achieving (electrical and mechanical) connection with the battery post 3.

Figure 3:
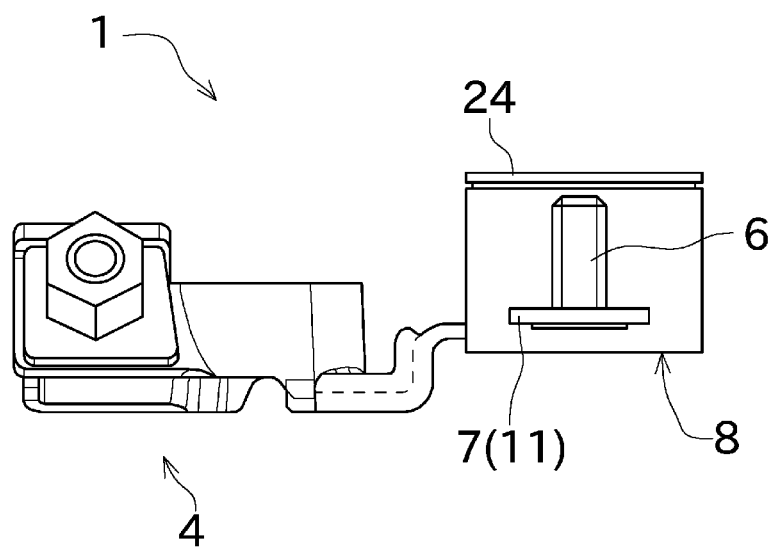
FIG. 3 A side view of the battery state detection apparatus.

As shown in FIG. 3, etc., the harness connecting part 6 is configured as a bolt (stud bolt). The harness 5 has, in its end portion, a terminal 13 (FIG. 1). As shown in FIG. 1, the harness connecting part 6 is received through the terminal 13, and additionally a nut 18 is tightened to the harness connecting part 6, which results in (electrical and mechanical) connection of the harness 5 to the harness connecting part 6.

Figure 4:
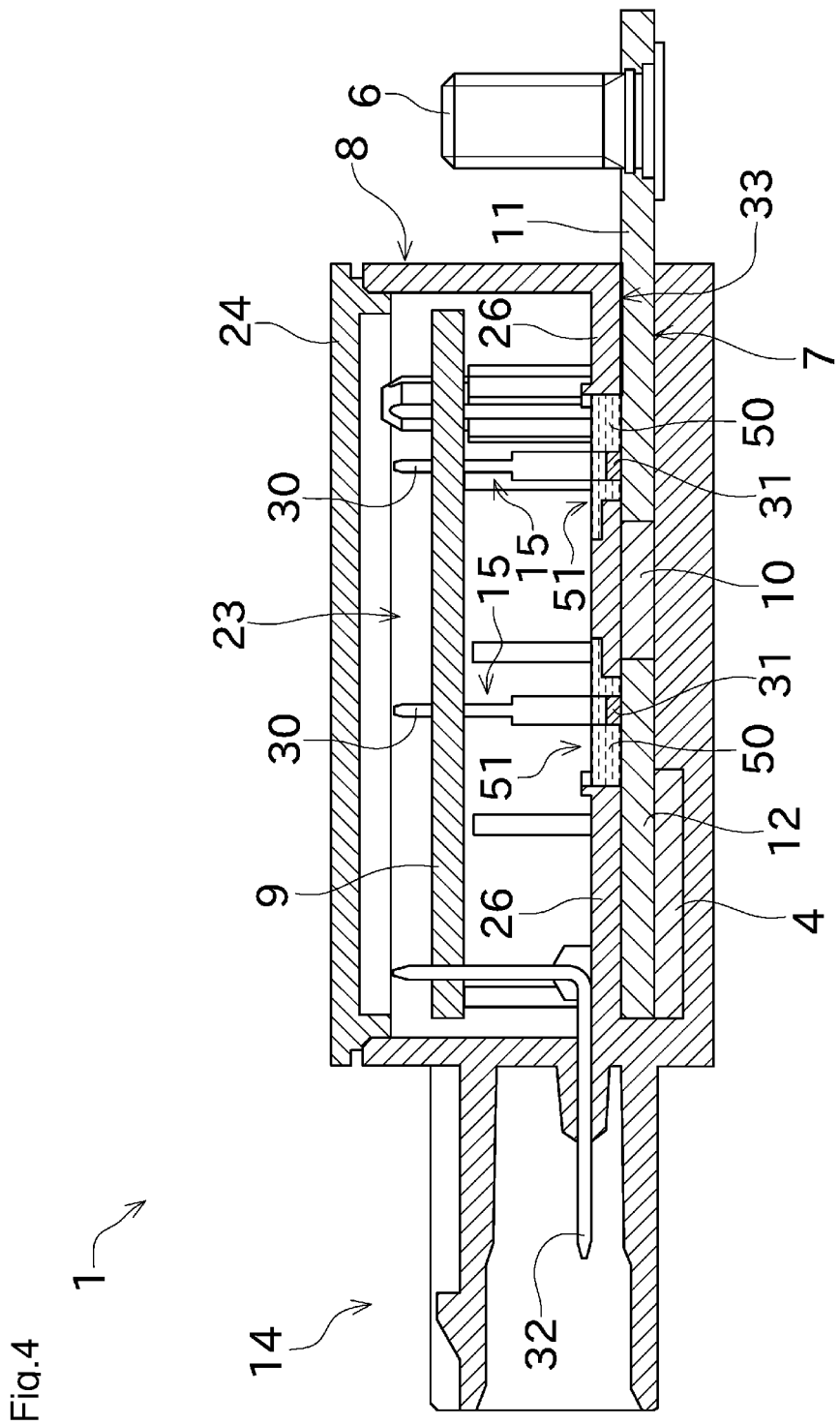
FIG. 4 A front cross-sectional view showing the battery state detection apparatus.

Next, the inside of the casing 8 will be described. The casing 8 is made of a resin, and has a box-like shape. As shown in FIG. 4, a storage space 23 for storing a circuit board 9 and the like is formed in the casing 8. The casing 8 also includes a lid part 24 that closes an opening of the storage space 23.

As shown in FIG. 4, a part of a shunt resistor 7 and a part of the battery post terminal 4 are arranged in the casing 8. A partition wall 26 that separates the storage space 23 and the shunt resistor 7 from each other is provided in the casing 8.

Figure 5:
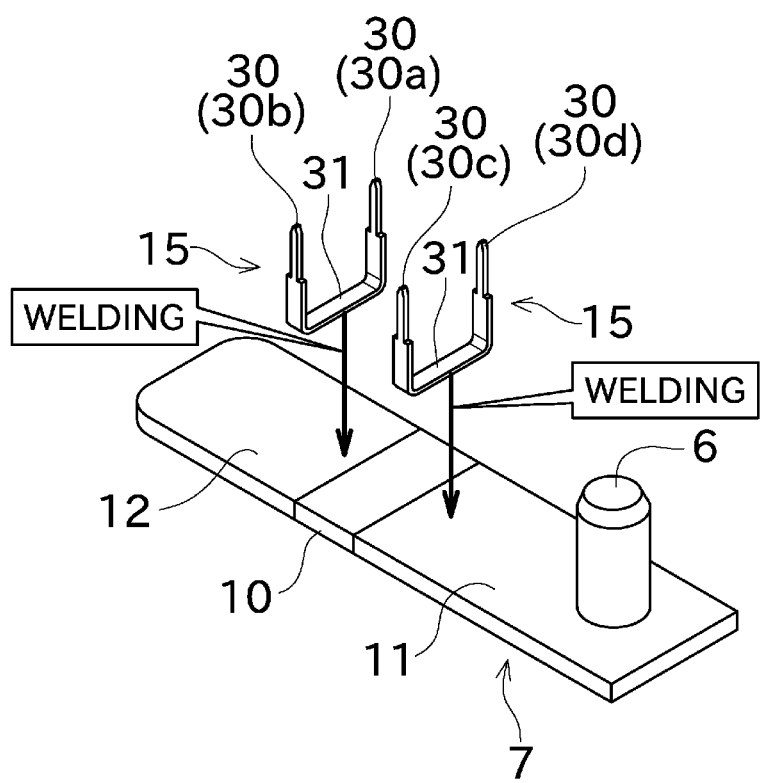
FIG. 5 A perspective view showing a situation where board connection terminals are mounted to a shunt resistor.

As shown in FIGS. 4 and 5, the shunt resistor 7 is configured such that a resistor element 10 (made of Manganin, for example) whose resistance value is known is arranged between a first conductor part 11 and a second conductor part 12. As shown in FIG. 5, each of the first conductor part 11, the second conductor part 12, and the resistor element 10 is in the shape of a flat plate. Thus, the shunt resistor 7 as a whole is in the shape of a flat plate. As shown in FIG. 5, etc., the shunt resistor 7 has an elongated shape elongated in a direction of arrangement of the first conductor part 11, the resistor element 10, and the second conductor part 12. Herein, the direction of arrangement of the first conductor part 11, the resistor element 10, and the second conductor part 12 will be called a longitudinal direction of the shunt resistor 7.

Referring to FIG. 4, the first conductor part 11 is arranged so as to partially protrude out of the casing 8. The harness connecting part 6 is provided on this protruding portion. The battery post terminal 4 is connected to the second conductor part 12 of the shunt resistor 7.

As shown in FIGS. 4 and 5, each of the first conductor part 11 and the second conductor part 12 of the shunt resistor 7 is provided with one board connection terminal 15. As shown in FIG. 4, each board connection terminal 15 is appropriately connected to an electronic circuit mounted on the circuit board 9. Thus, the shunt resistor 7 is electrically connected to the electronic circuit provided on the circuit board 9. For the connection of the shunt resistor 7 to the circuit board 9, it is necessary that the board connection terminal 15 is arranged to straddle opposite sides of the partition wall 26. This is why the partition wall 26 has terminal pass-through holes 51 that allow the board connection terminals 15 to pass therethrough.

The circuit board 9 is configured to apply pulse discharge via the board connection terminals 15 and to detect, for example, the intensity of a current having flowed through the resistor element 10 at that time via the board connection terminals 15. The casing 8 includes a connector 14 (see FIGS. 1 and 4) that outputs a result of the detection. The circuit board 9 is connected to an output terminal 32 (FIG. 4) provided in the connector 14, and configured to output a result of the detection through the output terminal 32. Another external device (for example, an engine control unit (ECU) of an automobile) connected to the connector 14 is able to determine the battery state based on the result of the detection outputted from the connector 14. Since a method for determining the battery state based on a detection result obtained through pulse discharge or the like is known, a detailed description thereof is omitted.

Next, a characteristic configuration of this embodiment will be described.

As shown in FIG. 5, each of the board connection terminals 15 of this embodiment is formed of a metal member in the shape of an elongated plate being bent twice at substantially right angles into a U-like shape (or C-like shape). Therefore, the board connection terminal 15 includes two connecting parts 30 and an intermediate part 31 integrated with one another. More specifically, the intermediate part 31 has a substantially linear shape. The two connecting parts 30, whose proximal ends are located at opposite ends of the intermediate part 31, linearly protrude in a direction substantially perpendicular to a longitudinal direction of the intermediate part 31. The two connecting parts 30 of the board connection terminal 15 are substantially in parallel to each other.

Figure 6:
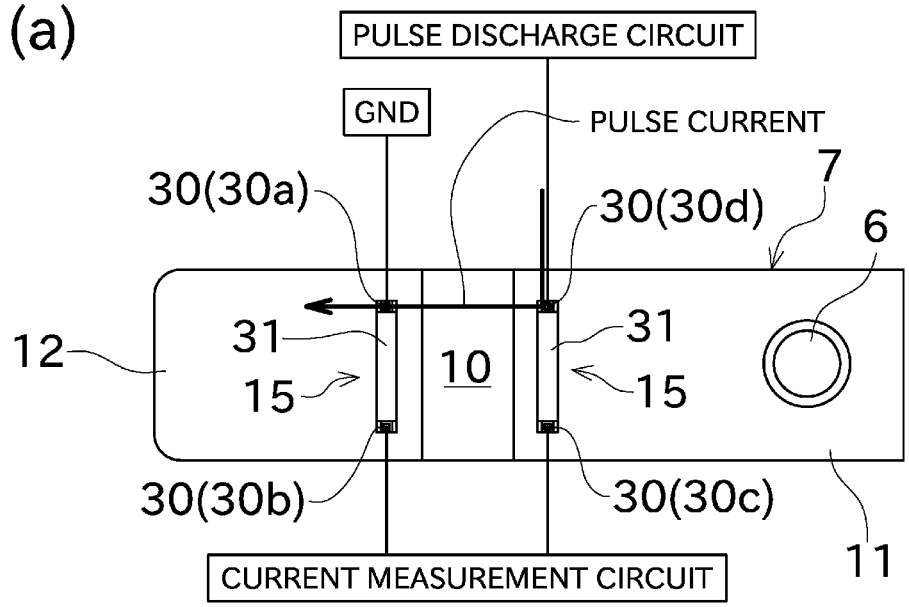
FIG. 6 (a) is a plan view of the shunt resistor; and (b) shows an electrical equivalent circuit of the battery state detection apparatus.
Figure 6:
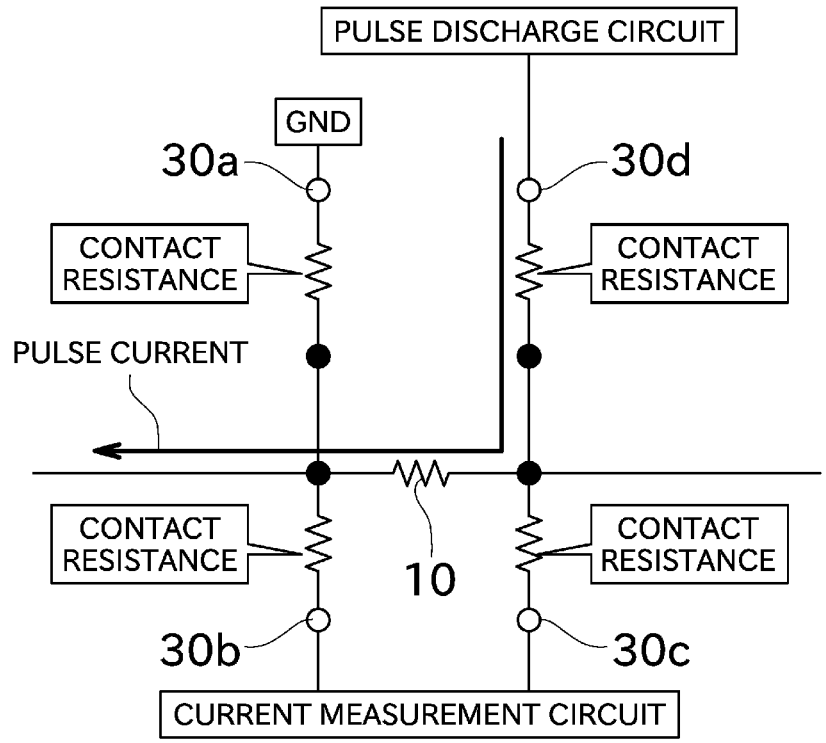

As shown in FIGS. 5 and 6(a), each of the first conductor part 11 and the second conductor part 12 is provided with the board connection terminal 15. Therefore, two board connection terminals 15 are arranged across the resistor element 10 therebetween. As shown in FIG. 6(a), the two board connection terminals 15 are arranged side by side with respect to the longitudinal direction of the shunt resistor (i.e., the horizontal direction in FIG. 6).

Referring to FIG. 5, each board connection terminal 15 is arranged with the intermediate part 31 thereof longitudinally extending along an upper surface of the first conductor part 11 or the second conductor part 12. Referring to FIG. 6(a), each board connection terminal 15 is arranged with the intermediate part 31 thereof longitudinally extending in the direction perpendicular to the direction (the horizontal direction in FIG. 6(a)) in which the two board connection terminals 15 are arranged side by side. Therefore, the four connecting parts 30 are located so as to define the corner points of a rectangle when seen in the longitudinal direction of the connecting part 30, as shown in FIG. 6(a).

As shown in FIGS. 4 and 5, etc., the connecting part 30 of the board connection terminal 15 is formed such that the proximal end portion thereof has a larger width than that of the distal end portion thereof. Providing the connecting part 30 with the proximal end portion having a larger width can ensure a strength of the connecting part 30. Since the distal end portion of the connecting part 30 is thin, heat of solder is not likely to diffuse when the distal end portion is soldered to the circuit board 9. This leads to enhancement of solderability. Since the circuit board 9 is electrically connected to a thin distal portion of the connecting part 30, a configuration is easily achievable in which resistance to conduction between this connecting portion and the proximal end portion (that is, resistance to conduction in the connecting part 30) is higher than resistance to conduction in the intermediate part 31. This is advantageous to measurement of a current by means of the four-terminal method.

The solder, which is fed from the upper side of the circuit board 9 (from the distal side of the connecting part 30), flows and intrudes via through holes of the circuit board 9 into the lower surface side of the circuit board 9 (toward the proximal side of the connecting part 30). In this embodiment, therefore, a portion of the connecting part 30 where the width is changed is arranged lower (closer to the proximal end portion) than the lower surface of the circuit board 9 (that is, the surface thereof located at the proximal side with respect to the longitudinal direction of the connecting part 30). In other words, a portion of the connecting part 30 having a larger width is arranged at a distance from the lower surface of the circuit board 9. Accordingly, even when solder flows and intrudes into the lower surface side of the circuit board 9, heat of the solder does not readily diffuse. Moreover, it is easy to ensure resistance to conduction as mentioned above.

As described above, the conventional configuration (FIG. 10(a)), in which the four connecting parts 30 are arranged in a straight line, involves the problem of difficulty in relieving vibrations and shocks of the circuit board 9. In this respect, this embodiment, in which the four connecting parts 30 are located so as to define the corner points of a rectangle, achieves a better-balanced arrangement of the connecting parts 30 as compared with the conventional configuration. Accordingly, even when vibrations or shocks are applied to the circuit board 9, the vibrations or shocks can be adequately distributed among the four connecting parts 30. Thus, this structure is able to withstand shocks and vibrations, and has an excellent durability.

The battery state detection apparatus 1 of this embodiment is characterized in one aspect thereof by a configuration in which the board connection terminals 15 are mounted to the shunt resistor 7 by means of welding.

More specifically, as shown in FIG. 5, the intermediate part 31 of the board connection terminal 15 is welded to the upper surface of the first conductor part 11 or the second conductor part 12, so that the board connection terminal 15 is (electrically and mechanically) connected to the shunt resistor 7. This can eliminate the need of the mounting screw 28 (FIG. 9) which has been conventionally required for mounting the board connection terminal 15.

Figure 9:
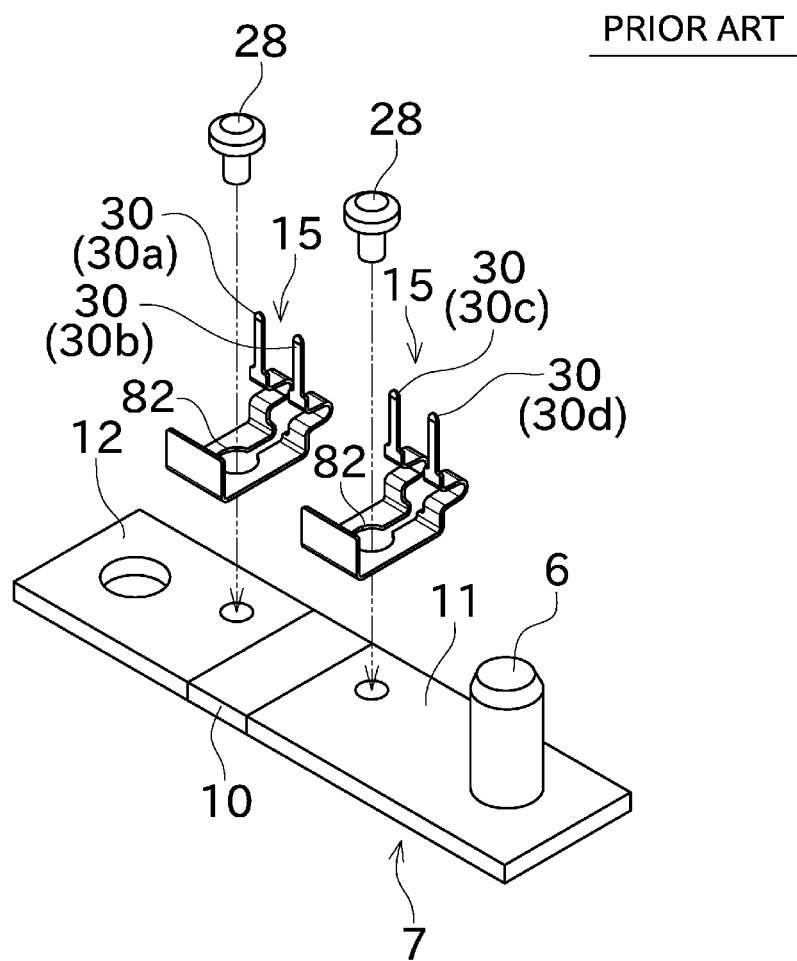
FIG. 9 A perspective view showing a situation where board connection terminals are mounted to a shunt resistor included in a conventional battery state detection apparatus.
Figure 10:
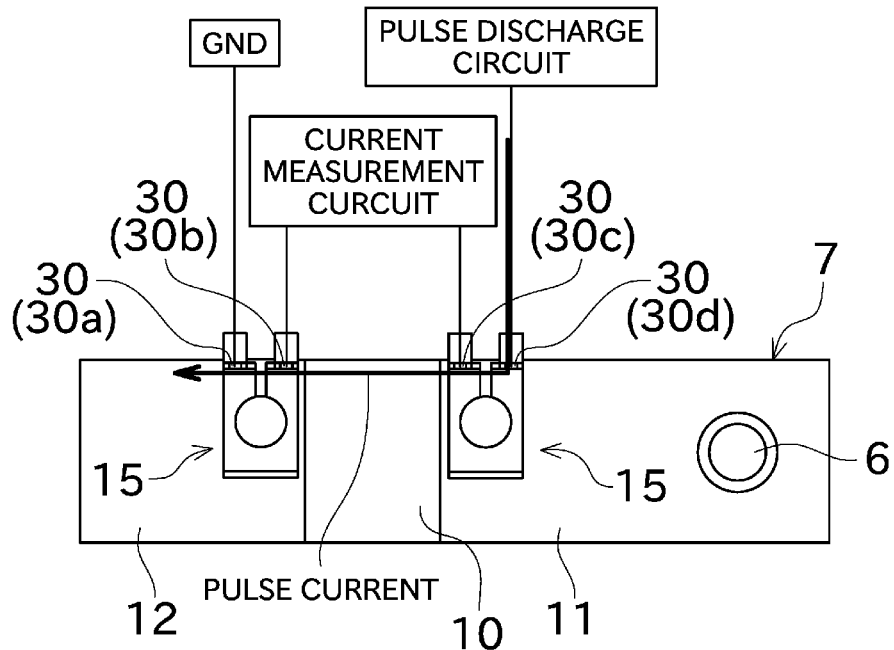
FIG. 10 (a) is a plan view of a conventional shunt resistor; and (b) shows an electrical equivalent circuit of the conventional battery state detection apparatus.
Figure 10:
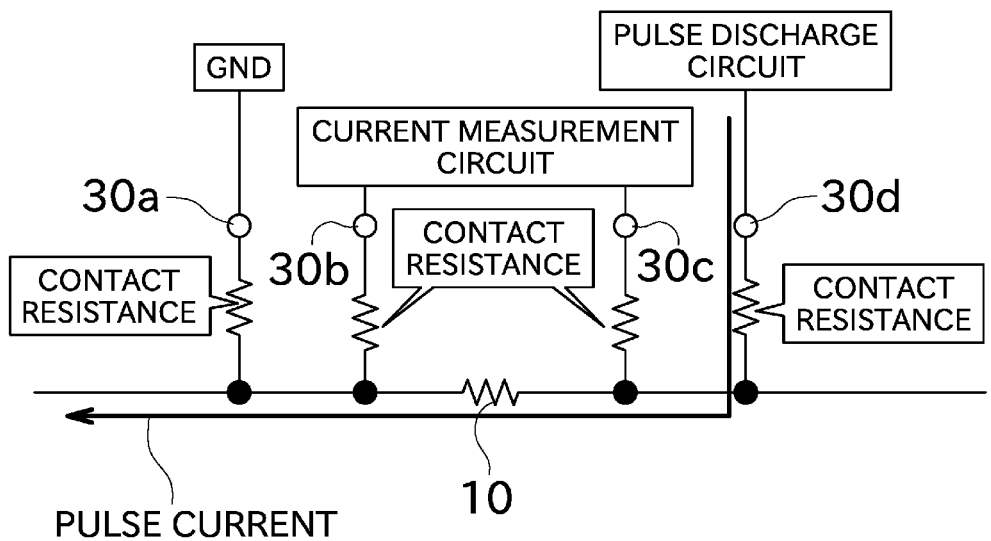

Additionally, the conventional configuration has required that the board connection terminal 15 have a reception hole 82 for receiving the mounting screw 28 therein, as shown in FIG. 9. This makes the shape of the board connection terminal 15 complicated as shown in FIG. 9, which results in an increase in the cost of the battery state detection apparatus.

In this point, this embodiment eliminates the need of the mounting screw 28, and therefore can also eliminate the need to provide the reception hole 82 in the board connection terminal 15, thus permitting the board connection terminal 15 to have a simple shape. To be more specific, as mentioned above, the board connection terminal 15 of this embodiment is a metal member in the shape of an elongated plate being bent into a U-like shape (or C-like shape), which is simplified as compared with the conventional shape (FIG. 9). Accordingly, the board connection terminal 15 can be manufactured at a lower cost as the conventional one. Therefore, the cost of manufacture of the battery state detection apparatus 1 can be reduced.

In this embodiment, welding is adopted to connect the board connection terminal 15 to the shunt resistor 7. This reduces contact resistance between the board connection terminal 15 and the shunt resistor 7 as compared with the conventional connection using the mounting screw 28. As a result, precise measurement is enabled by means of the so-called four-terminal method. Accordingly, the accuracy of measurement is not inferior to that of the conventional configuration that adopts the mounting screw 28.

Next, a description will be given of the fact that the configuration of this embodiment enables measurement based on the four-terminal method.

Referring to FIGS. 5 and 6(*a*), the two connecting parts of the board connection terminal 15 arranged on the first conductor part 11 are denoted by the reference signs 30*c*, 30*d*. The two connecting parts of the board connection terminal 15 arranged on the second conductor part 12 are denoted by the reference signs 30*a*, 30*b*.

As shown in FIG. 6(*a*), the connecting part 30*a* arranged on the second conductor part 12 and the connecting part 30*d* arranged on the first conductor part 11 are opposed to each other across the resistor element 10. The connecting part 30*a* is connected to circuit ground on the circuit board 9. The connecting part 30*d* is connected to a pulse discharge circuit provided on the circuit board 9. The pulse discharge circuit is configured to apply pulse discharge via the connecting part 30*d*. A pulse current generated by the pulse discharge flows via the connecting part 30*d* to the first conductor part 11, the resistor element 10, and the second conductor part 12 in this order. The pulse current further flows to the battery post 3 (FIG. 1) via the battery post terminal 4 that is connected to the second conductor part 12.

As shown in FIG. 6(*a*), the connecting part 30*b* arranged on the second conductor part 12 and the connecting part 30*c* arranged on the first conductor part 11 are opposed to each other across the resistor element 10. The connecting parts 30*b* and 30*c* are connected to a current measurement circuit provided on the circuit board 9. The current measurement circuit is configured to measure a voltage drop across the connecting part 30*b* and the connecting part 30*c* to thereby detect the intensity of a current having flowed through the resistor element 10 at a time of the pulse discharge. FIG. 6(*b*) shows an electrical equivalent circuit of the battery state detection apparatus 1 having the configuration of this embodiment.

A method that adopts the above-described configuration in which terminals (the connecting part 30*a* and the connecting part 30*d*) used for a current flow are provided separately from terminals (the connecting part 30*b* and the connecting part 30) used for current measurement is known as the four-terminal method, which enables precise current measurement. Accordingly, the battery state detection apparatus 1 of this embodiment is able to detect the state of the battery 2 with a high accuracy.

Figure 7:
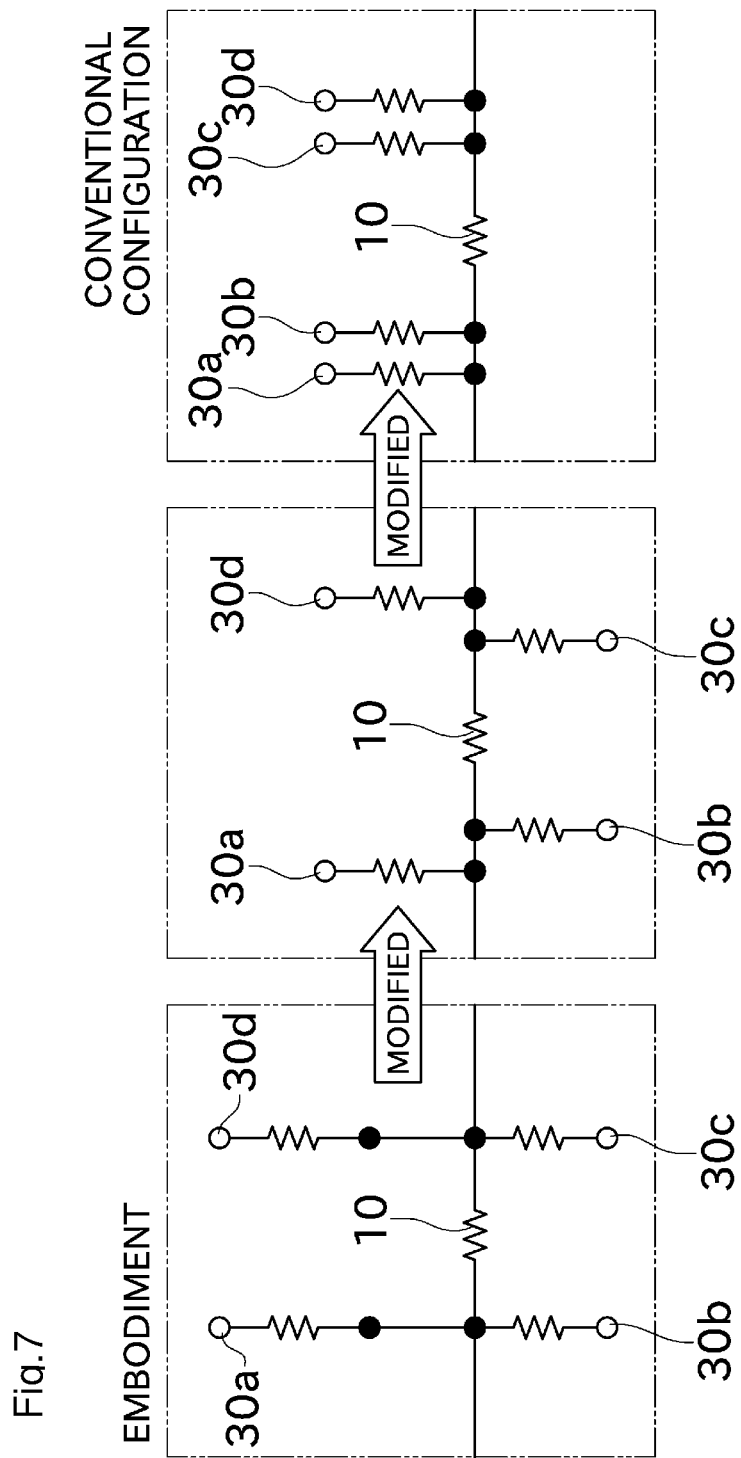
FIG. 7 A diagram for explanation of equivalence of an electrical equivalent circuit of the embodiment and conventional one.

In this embodiment, as mentioned above, arrangement of the four connecting parts 30 is different from conventional, and therefore a path of the current flow is also different from conventional. Referring to FIG. 7, however, the electrical equivalent circuit of the battery state detection apparatus 1 of this embodiment can be modified into the electrical equivalent circuit of the conventional battery state detection apparatus. Accordingly, the battery state detection apparatus 1 of this embodiment as well as the conventional one is capable of measurement based on the four-terminal method.

In this embodiment, as mentioned above, the board connection terminal 15 is connected to the shunt resistor 7 by welding, and therefore the contact resistance between the board connection terminal 15 and the shunt resistor 7 is extremely low. In this embodiment, moreover, the board connection terminal 15 is designed such that the intermediate part 31 has the width and length that ensure a sufficiently higher conductor resistance than the contact resistance. Furthermore, the width and length of the intermediate part 31 are determined in relation to the width and length of the connecting part 30 such that the conductor resistance of the connecting part 30 is even higher than the conductor resistance of the intermediate part 31. This enables a current to be measured based on Theory of the four-terminal method is enabled.

If the pulse current that is caused to flow to the connecting part 30*d* at a time of the pulse discharge by the pulse discharge circuit flowed into the connecting part 30*c* via the intermediate part 31, the independency of the connecting part 30*c* and the connecting part 30*d* would be lost, resulting in failure to obtain the effects of the four-terminal method. Therefore, as described above, the conductor resistance of the intermediate part 31 is set sufficiently higher than the contact resistance between the board connection terminal 15 and the shunt resistor 7 while the conductor resistance of the connecting part 30 is set even higher than the conductor resistance of the intermediate part 31. This can prevent the pulse current from flowing into the connecting part 30*c* via the intermediate part 31. Thus, the configuration of this embodiment enables precise measurement based on Theory of the four-terminal method, because the independency of the connecting part 30*c* and the connecting part 30*d* can be maintained.

The inventors of the present application have conducted experiments to actually measure current, in order to find out the accuracy of measurement of the battery state detection apparatus 1 of this embodiment having the above-described configuration. Results thereof are shown in FIG. 8. In FIG. 8, the "sensor" row indicates current values measured by the current measurement circuit provided on the circuit board 9.

The "logger" row indicates values recorded as the intensity of the pulse current that actually flowed through the resistor element 10. Differences therebetween (indicated in the "difference" row) can be considered as measurement errors in the battery state detection apparatus 1.

As shown in FIG. 8, the measurement errors in the battery state detection apparatus 1 of this embodiment were at most 0.015[A]. It was therefore confirmed that the battery state detection apparatus 1 has a sufficient degree of accuracy of measurement.

Next, the structure of the casing 8 that stores the shunt resistor 7 of this embodiment will be detailed.

The conventional battery state detection apparatus is configured such that, after the casing 8 is molded, the shunt resistor 7 is assembled to the casing. Thus, the conventional configuration requires a screw or the like for fixing the shunt resistor 7 to the casing 8.

In this embodiment, on the other hand, the casing 8 is injection-molded while the shunt resistor 7 with the board connection terminals 15 welded thereto is inserted. The shunt resistor 7 and the casing 8 are fixed to each other by the insertion. Therefore, this embodiment does not require a screw or the like for fixing the shunt resistor 7 to the casing 8.

Additionally, molding the casing 8 with the shunt resistor 7 inserted provides enhanced adhesion between them. Thus, in the battery state detection apparatus 1 of this embodiment, the hermetic sealing of the casing 8 is enhanced as compared with conventional. Accordingly, the reliability of the battery state detection apparatus 1 can be further enhanced.

The casing 8 is made of a resin while the shunt resistor 7 is made of a metal. Even though the casing 8 is molded with the shunt resistor 7 inserted, they are not completely adhered to each other. Therefore, the possibility that a portion between the shunt resistor 7 and the casing 8 (for example, a portion 33 indicated by the bold line in FIG. 4) can be a path through which water may enter the casing 8 cannot completely be eliminated. Water that has entered the casing 8 through an entry path 33 may enter the storage space 23 through the terminal pass-through holes 51. Conversely, as long as the terminal pass-through holes 51 are closed, entry of water into the storage space 23 can be hindered.

In this embodiment, therefore, the terminal pass-through holes 51 are filled with a sealant (made of urethane, for example) 50, as shown in FIG. 4. The sealant 50 is loaded so as to cover the intermediate parts 31 of the board connection terminals 15. That is, in the board connection terminals 15 of this embodiment, only the connecting parts 30 are exposed to the inside of the storage space 23, and the intermediate parts 31 covered with the sealant 50 are not exposed to the inside of the storage space 23.

In this embodiment, the terminal pass-through hole 51 are filled with the sealant 50. Thereby, the terminal pass-through hole 51 is closed and additionally exposure of the board connection terminal 15 to the inside of the storage space 23 is minimized. Therefore, even if water enters the casing 8 through the entry path 33, entry of the water into the storage space 23 can be hindered. The configuration of the battery state detection apparatus 1 of this embodiment provides the casing 8 with assured waterproofness.

As thus far described, the battery state detection apparatus 1 of this embodiment includes the shunt resistor 7 and the board connection terminals 15. The shunt resistor 7 includes the resistor element 10. The board connection terminal 15 is connected to the circuit board 9 that detects a current having flowed through the resistor element 10. The board connection terminal 15 includes the intermediate part 31 and the two connecting parts 30 integrated with one another. The intermediate part 31 has a substantially linear shape, and is connected to the shunt resistor 7. The two connecting parts 30 have the proximal ends thereof located at the opposite ends of the intermediate part 31, and protrude in the direction substantially perpendicular to the intermediate part 31, to be connected to the circuit board 9. The two connecting parts 30 are arranged substantially in parallel to each other. The board connection terminal 15 comprises the two board connection terminals 15 that are arranged with the resistor element 10 sandwiched therebetween. The contact resistance between the intermediate part 31 and the shunt resistor 7 is lower than the conductor resistance of the intermediate part 31.

Since the board connection terminal 15 has a substantially C-like shape (or a substantially U-like shape), the configuration of the board connection terminal 15 is simplified as compared with conventional. Thus, downsizing can be achieved. The configuration in which the contact resistance between the intermediate part 31 and the shunt resistor 7 is set sufficiently lower than the conductor resistance of the intermediate part 31 enables a current to be measured based on the four-terminal method, thus achieving measurement with a high accuracy.

Although a preferred embodiment of the present invention has been described above, the above-described configuration can be modified, for example, as follows.

In the embodiment, the shunt resistor 7 is inserted during the molding of the casing 8. This, however, is not limiting. The conventional process may be also acceptable in which the shunt resistor 7 is assembled to the casing 8 after the molding of the casing 8.

Filling the terminal pass-through holes 51 with the sealant 50 may be omitted.

The shapes of the shunt resistor 7, the board connection terminal 15, and the like, are not limited to the illustrated ones, and may be changed as appropriate.

DESCRIPTION OF THE REFERENCE NUMERALS 1 battery state detection apparatus
7 shunt resistor
15 board connection terminal
23 storage space
30 connecting part

The invention claimed is:

1. A battery state detection apparatus comprising:
a shunt resistor including a resistor element; and
a board connection terminal connected to a circuit board that detects a current having flowed through the shunt resistor, wherein:
the board connection terminal comprises including an intermediate part and two connecting parts integrated with one another,
the intermediate part having a substantially linear shape and connected to the shunt resistor, and
the two connecting parts having proximal ends thereof located at opposite ends of the intermediate part, and protruding in a direction substantially perpendicular to the intermediate part, to be connected to the circuit board, the two connecting parts being arranged substantially in parallel to each other,
the board connection terminal is arranged such that the two board connection terminals sandwich the shunt resistor therebetween, and a first contact resistance between the intermediate part and the shunt resistor is lower than a second conductor resistance of the intermediate part.

2. The battery state detection apparatus according to claim 1, wherein the board connection terminal comprises four connecting parts arranged so as to define corner points of a rectangle when seen in a longitudinal direction of the connecting parts.

3. The battery state detection apparatus according to claim 1, wherein the intermediate part is connected to the shunt resistor by welding.

4. The battery state detection apparatus according to claim 1, wherein a proximal end portion of a first connecting part of the two connecting parts has a first width that is wider than a second width of a distal end portion of the first connecting part, and wherein the two connecting parts are connected to the circuit board.

5. The battery state detection apparatus according to claim 1, wherein the circuit board is electrically connected to a first connecting part of the two connecting parts of the board connection terminal.

* * * * *